United States Patent
Chaturvedi et al.

(10) Patent No.: US 9,153,991 B2
(45) Date of Patent: Oct. 6, 2015

(54) SYSTEM AND METHOD FOR FAST CHARGING OF LITHIUM-ION BATTERIES WITH IMPROVED SAFETY

(71) Applicant: Robert Bosch GmbH, Stuttgart (DE)

(72) Inventors: Nalin Chaturvedi, Sunnyvale, CA (US); Reinhardt Klein, Mountain View, CA (US); John F. Christensen, Mountain View, CA (US); Jasim Ahmed, Mountain View, CA (US); Aleksandar Kojic, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 181 days.

(21) Appl. No.: 13/933,698

(22) Filed: Jul. 2, 2013

(65) Prior Publication Data
US 2014/0002031 A1 Jan. 2, 2014

Related U.S. Application Data

(60) Provisional application No. 61/667,121, filed on Jul. 2, 2012.

(51) Int. Cl.
*H02J 7/00* (2006.01)
*H01M 10/44* (2006.01)
(Continued)

(52) U.S. Cl.
CPC .............. *H02J 7/007* (2013.01); *H01M 10/44* (2013.01); *H01M 10/443* (2013.01); *G01R 31/3651* (2013.01); *H01M 10/0525* (2013.01); *Y02T 10/7011* (2013.01)

(58) Field of Classification Search
CPC .................................. H02J 7/007; H02J 7/04
USPC .......... 320/134, 152, 157, 164; 324/427, 434; 702/63
See application file for complete search history.

(56) References Cited

U.S. PATENT DOCUMENTS 6,075,342 A 6/2000 Koenck
7,489,107 B2 2/2009 Hartley et al.
(Continued)

FOREIGN PATENT DOCUMENTS

EP 1100169 A2 5/2001

OTHER PUBLICATIONS

Arora et al., "Mathematical modeling of the Lithium Deposition Overcharge Reaction in Lithium-Ion Batteries Using Carbon Based Negative Electrodes", Journal of the Electrochemical Society; 1999; pp. 3543-3553; USA (11 pages).
(Continued)

*Primary Examiner* — Paul Dinh
(74) *Attorney, Agent, or Firm* — Maginot Moore & Beck LLP

(57) ABSTRACT

In one embodiment, an electrochemical battery system performs optimized charging of a battery. The electrochemical battery system includes at least one electrochemical cell, a memory storing command instructions, and a controller operably connected to the memory and a current source. The controller executes the command instructions to generate a first prediction of at least one state parameter corresponding to an internal state of the at least one electrochemical cell in the event that a first input current is applied to the at least one electrochemical cell for a predetermined time based upon a present state of the at least one state parameter in the electrochemical cell, determine a second input current based on the first prediction and at least one predetermined state parameter constraint, and control the current source to apply the second input current to the at least one electrochemical cell.

17 Claims, 7 Drawing Sheets

(51) Int. Cl.
*H01M 10/0525* (2010.01)
*G01R 31/36* (2006.01)

(56) References Cited

U.S. PATENT DOCUMENTS

| | | | |
|---|---|---|---|
| 7,898,220 | B2 | 3/2011 | Guang et al. |
| 8,040,106 | B2 | 10/2011 | Ishikawa |
| 8,040,110 | B2 | 10/2011 | Al-Anbuky et al. |
| 2005/0057255 | A1* | 3/2005 | Tate et al. ............... 324/426 |
| 2005/0099157 | A1 | 5/2005 | Hercog et al. |
| 2008/0191667 | A1 | 8/2008 | Khernahan et al. |
| 2009/0256528 | A1 | 10/2009 | Greening et al. |
| 2009/0273320 | A1 | 11/2009 | Ungar et al. |
| 2010/0085057 | A1* | 4/2010 | Nishi et al. ............... 324/427 |
| 2011/0012563 | A1 | 1/2011 | Paryani et al. |
| 2011/0199053 | A1 | 8/2011 | Minamiura |
| 2011/0285356 | A1 | 11/2011 | Maluf et al. |
| 2012/0098481 | A1* | 4/2012 | Hunter et al. ............. 320/106 |

OTHER PUBLICATIONS

Chaturvedi et al., "Algorithms for Advanced Battery-Management Systems", IEEE Control Systems Magazine; 2010; pp. 49-68; vol. 30, No. 3 (20 pages).
Christensen, "Modeling Diffusion-Induced Stress in Li-ion Cells with Porous Electrodes", Journal of the Electrochemical Society; 2010; pp. A366-A380; vol. 157, No. 3; Palo Alto, USA (15 pages).
Christensen et al., "Stress generation and fracture in lithium insertion materials", Journal of Solid State Electrochemistry; 2006; pp. 293-319; vol. 10; Berkley, USA (27 pages).
Doyle et al, "Modeling of Galvanostatic Charge and Discharge of the Lithium/Polymer/Insertion Cell", Journal of the Electrochemical Society; 1993; pp. 1526-1533; vol. 140, No. 6; Berkeley, USA (8 pages).
Findeisen et al., "State and Output Feedback Nonlinear Model Predictive Control: An Overview", European Journal of Control; 2003; pp. 190-207; vol. 9, No. 2-3; Europe (17 pages).
Klein et al., "State estimation of a reduced electrochemical model of a lithium-ion battery", Proceedings of the American Control Conference; 2010; pp. 6618-6623; Baltimore, USA (6 pages).
Liu et al., "Search for an optimal rapid charging pattern for lithium-ion batteries using ant colony system algorithm", IEEE Transactions on Industrial Electronics; 2005; pp. 1328-1336; vol. 52, No. 5; Taiwan R.O.C. (9 pages).
Luo et al, "Search for an Optimal Multistage Charging Pattern for Lithium-Ion Batteries using the Taguchi Approach", IEEE; 2009; pp. 1-5; Taiwan (5 pages).
Notten et al., "Boostcharging Li-ion batteries: A challenging new charging concept", Journal of Power Sources; 2005; pp. 89-94; vol. 145; Elsevier; The Netherlands (6 pages).
Purushothaman et al., "Rapid Charging of Lithium-Ion Batteries Using Pulsed Currents", Journal of the Electrochemical Society; 2006; pp. A533-A542; vol. 153; Cleveland, USA (10 pages).
Smith, "Electrochemical Control of Lithium-Ion Batteries", IEEE Control Systems Magazine; Apr. 2010; pp. 18-25; vol. 30, No. 2 (8 pages).
Thomas et al., "Mathematical Modeling of Lithium Batteries", Advances in Lithium-Ion Batteries; 2002; pp. 345-392; Kluwe Academic/Plenum Publishers; USA (48 pages).
International Search Report and Written Opinion for Corresponding Application (i.e., PCT/US2013/049104), mailed Sep. 13, 2013 (10 pages).

* cited by examiner

SYSTEM AND METHOD FOR FAST CHARGING OF LITHIUM-ION BATTERIES WITH IMPROVED SAFETY

CLAIM OF PRIORITY

This application claims priority to a U.S. Provisional application having Ser. No. 61/667,121, which is entitled "System And Method For Fast Charging Of Lithium-Ion Batteries With Improved Safety," and was filed on Jul. 2, 2012, the contents of which are expressly incorporated herein by reference.

FIELD

This disclosure relates generally to rechargeable batteries and, more specifically, to methods for recharging lithium-ion batteries.

BACKGROUND

Currently, Li-ion based batteries are believed to be the most promising battery system for HEV/PHEV/EV applications due to their high energy density, lack of hysteresis and low self-discharge currents. However, a formidable challenge lies in fast charging of Li-ion batteries where standard charging techniques such as CC-CV, if used for fast charging, can result in damage to the battery due to the large currents passed through the battery. These large currents result in overpotentials and mechanical stress in the battery that can accelerate the aging process of the battery and resulting in reduced lifetime.

There is an increasing trend towards the electrification of the automobile, and most car manufacturers have announced plans to produce plug-in hybrid and electric vehicles. Besides other technological challenges, one important aspect of an electric vehicle is the time needed to recharge the battery pack. Advanced battery management systems need to provide adequate charging strategies for refueling the battery pack in a fast and reliable manner.

Although it is widely recognized that an appropriate charging strategy of the battery is critical for preventing damage and performance degradation, in general only current and voltage limits are considered during the charging process. For example, voltage limits may be too conservative for new batteries and possibly inappropriate for use with aged batteries due to the changed behavior.

Most charging strategies are ad hoc methods, where certain design parameters determine the major part of some rule based control design. Fast charging of batteries is a popular research topic in the field of electrochemistry, however, this problem has received very little attention in the field of control systems. Popular charging strategies are constant-current/constant-voltage (CC/CV), pulse current charging, and pulse voltage charging, with CC/CV being the most widespread method to recharge Li-ion batteries. However, the existing approaches fail to achieve a maximum performance as determined by the electrochemistry of the battery.

In an ideal battery, and without limitation of the charging unit, one could pass all the charge needed to bring a battery from one state of charge (SOC) to another SOC instantaneously. Kinetic limitations in real batteries, however, allow only a finite current to be passed through a battery. Many internal processes of the battery have an influence on the charge transfer capabilities, e.g. finite diffusion rate of lithium ions in the electrolyte, reduction/oxidation of materials other than the active material, formation of resistive films on the active particle surface, and charge transfer limitation between the electrolyte and the active material. The faster the charge transfer is forced to happen, the more strongly these processes affect the health of the battery. Cell manufacturers thus always provide additional information about utilization constraints on their cells. These constraints mostly involve limits on the maximum charge or discharge current, limits of lower and upper cut-off voltages, and the operating temperature domain. Some manufacturers provide these limits at different operating ambient temperatures. All these limits are geared towards the CC/CV charging method, and hence are rather conservative, since the limits are specified for the complete lifetime of the battery.

In light of the foregoing limitations, improved methods for charging batteries, and lithium-ion batteries in particular, that reduce the time required to charge the battery while avoiding excessive degradation and aging of the battery during the charging process would be beneficial. Additionally, systems for controlling the charging process for batteries in an improved manner would be beneficial.

SUMMARY

In one embodiment, an electrochemical battery system performs optimized charging of a battery. The electrochemical battery system includes at least one electrochemical cell, a memory in which command instructions are stored, and a controller operably connected to the memory and a current source. The controller is configured to execute the command instructions to generate a first prediction of at least one state parameter corresponding to an internal state of the at least one electrochemical cell in the event that a first input current is applied to the at least one electrochemical cell for a predetermined time based upon a present state of the at least one state parameter in the electrochemical cell, determine a second input current based on the first prediction and at least one predetermined state parameter constraint, and control the current source to apply the second input current to the at least one electrochemical cell.

In another embodiment, an optimized method of charging an electrochemical battery has been developed. The method includes generating a first prediction of at least one state parameter corresponding to an internal state of at least one electrochemical cell in the event that a first input current is applied to the at least one electrochemical cell for a predetermined time based upon a present state of the at least one state parameter in the electrochemical cell, determining a second input current based on the first prediction and at least one predetermined state parameter constraint, and controlling a current source to apply the second input current to the at least one electrochemical cell.

DETAILED DESCRIPTION

For the purposes of promoting an understanding of the principles of the embodiments described herein, reference is now be made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Described herein is a method for fast charging of lithium ion batteries with improved safety of the battery using optimal control theory. In particular, this document describes methods for generating optimized solutions for the minimum-time charging problem, where different constraints on internal battery states are considered. Based on the features appearing in the open-loop optimal charging solution, this document describes a one-step predictive controller, which incidentally recovers the time-optimal solution, while being feasible for real-time computations. Simulation results suggest a decrease in charging time by 50% compared to the conventional constant current/constant-voltage method for lithium-ion batteries.

Standard charging techniques such as CC-CV, if used for fast charging, can result in damage to the battery due to the large currents passed through the battery. These large currents result in dangerous overpotentials and mechanical stress in the battery that causes the battery to age fast resulting in reduced lifetime. A method for fast charging while maintaining safe operation of the battery is described using optimal control theory. In particular, the method focuses on the minimum-time charging problem, where different constraints on internal battery states are considered. Based on the features appearing in the open-loop optimal charging solution, another charging method incorporates a one-step predictive controller, which incidentally recovers the time-optimal solution, while enabling real-time computations using commercially available digital processors. Simulation results of the methods described herein suggest a decrease in charging time by 50% compared to the conventional constant current/constant-voltage charging method for lithium-ion batteries.

Figure 1:
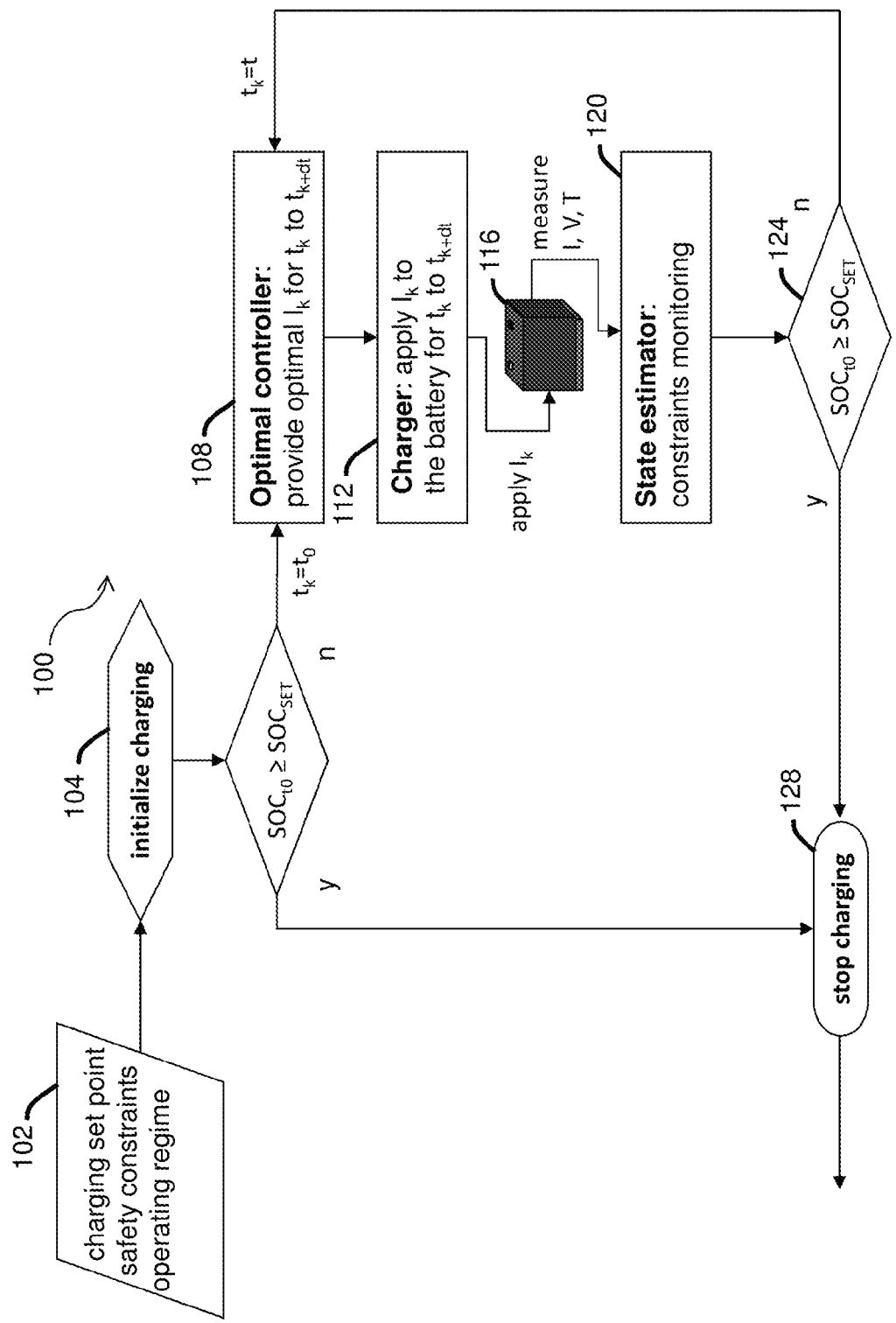
FIG. 1 is a block diagram of a process for charging a battery.

In one embodiment, a fast battery charging process includes a controller implements a process based on a time optimal control problem to adjust an electrical current and voltage that is applied to charge a battery. FIG. 1 depicts a process 100 for charging a battery 116. In process 100, a predetermined charging set point 102 includes operating constraints for the charging process, such as the desired charge set point for the battery 116 at the conclusion of the charge process, and other constraints such as maximum current, voltage, and battery temperature constraints. The charge process initializes (block 104) and an optimal controller 108 dynamically selects a level of electrical current $I_K$ to be provided to the battery 116 during a series of time increments $t_k$ during the charge process. In one embodiment, the optimal controller 108 is embodied as stored programmed instructions that are performed by a digital microprocessor or other computing device. An electrical charger 112 applies the selected current to the battery 116. The electrical charger 112 is configured to apply different levels of electrical current/to the battery with reference to different electrical current levels that are selected by the optimal controller 108. During process 100, sensors, which can be integrated with the battery 116 or can be separate sensor devices, monitor the current (I), voltage (V), and internal temperature (T) in the battery 116. A state estimator 120, which is implemented as part of the optimal controller 108, monitors the current, voltage, and temperature with reference to the predetermined limits in the charging constraints 102. The state estimator generates a model of the internal state of the battery 116 using a combination of voltage, current and temperature measurements via reference electrodes or existing measurements and using either a physics-based or a data-based model of the battery. Using this data, the state estimator 120 estimates internal states such as but not limited to side-reaction overpotentials, local concentrations, concentration gradients, stress gradients, and internal temperature. These estimates are monitored with reference to predetermined limits in 102 and are also made available to optimal controller 108. During the charge process, the optimal controller 108 adjusts the current that is applied to the battery 116 with reference to feedback from the state estimator 120. The optimal controller 108 ensures that the charging process 100 does not exceed voltage, current, temperature and internal states constraints for the battery 116, and that the charging process is optimized to complete the charge in an efficient manner given the constraints. The feedback loop continues for charging the battery 116 until the state estimator 120 identifies that a state of charge of the battery 116 has reached the predetermined state of charge set point (block 124), and the charge process 100 ceases application of the charge current to the recharged battery 116 (block 128).

Figure 2:
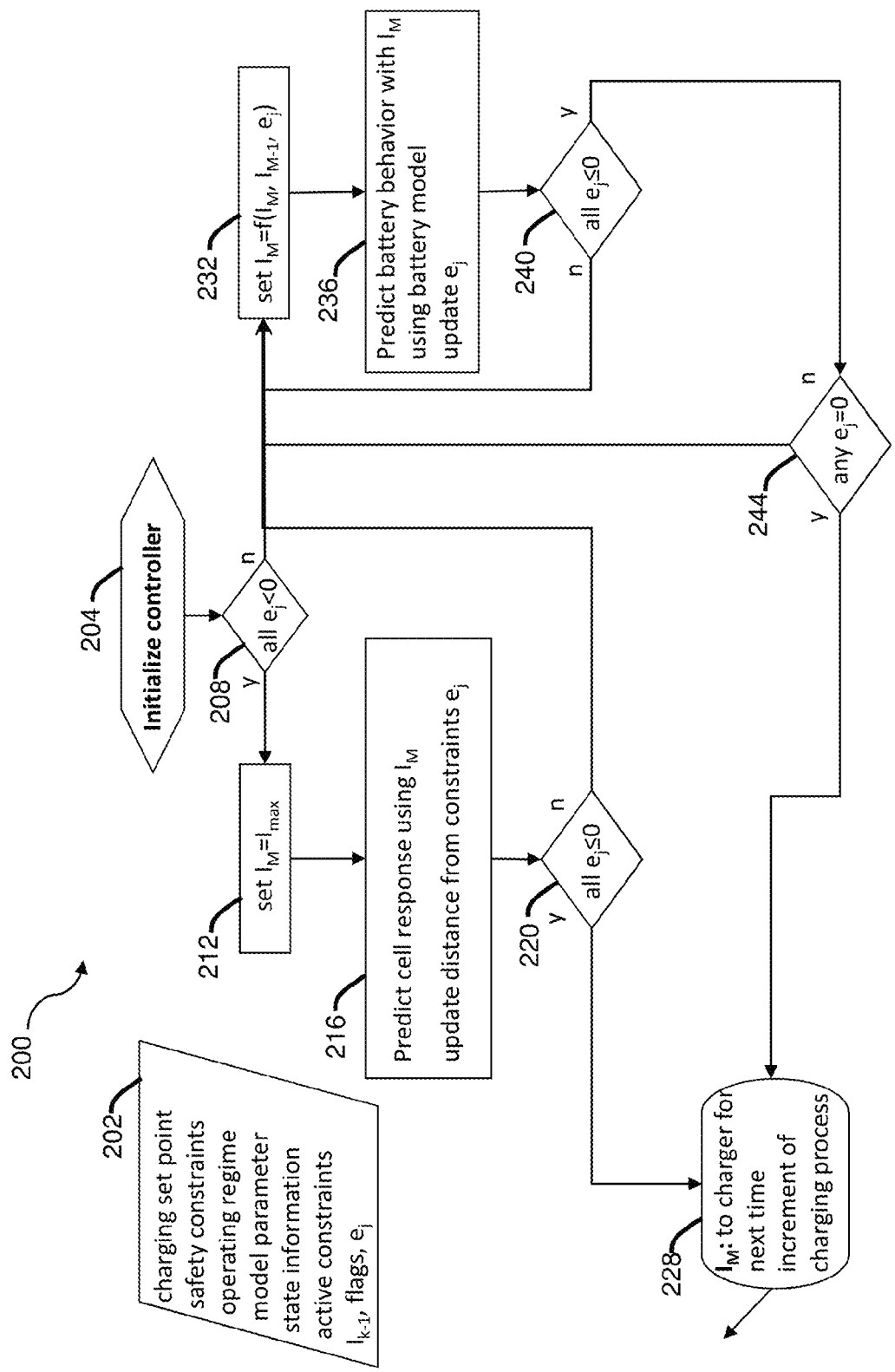
FIG. 2 is a block diagram of an optimization process that is incorporated with the charging process of FIG. 1.

FIG. 2 depicts a process 200 that is performed by the optimal controller 108 of FIG. 1. Process 200 adjusts a level of an electrical current I that is applied to the battery 116 during each of the K time increments of the process 100 described above. The model parameters 202 include parameters that correspond to the physical and chemical configuration of the battery 116, and include constraints $e_j$ on current, voltage, temperature, and internal states that are used to limit the level of current applied to the battery based on the feedback from the current state of the battery and predictions from the model of the future state of the battery when a given level of current is applied to the battery during the charging process. During process 200, the optimal controller 108 adjusts the current that is applied to the battery for the next time increment in process 100. Process 200 selects a current $I_M$ with reference to a plurality of constraint parameters $e_j$ that are identified based on the model of the internal characteristics of the battery 116. In the example of FIG. 2, an individual constraint is satisfied when a value of $e_j$ is less than zero, the constraint is at a maximum limit when the value of $e_j$ is substantially equal to zero, and the constraint is exceeded when $e_j$ is greater than zero. Process 200 applies either the maximum current level that is available from the charger 112 to charge the battery 116, or identifies a lower current level that satisfies each of the constraint parameters $e_j$, with at least one of the constraint parameters $e_j$ being at the maximum limit.

Process 200 begins when the controller, such as a digital computer performing stored program instruction, is initialized with the model parameters, data from sensors pertaining to the present state of the battery, and the constraints 202 (block 204). If all of the constraint values $e_j$ are less than zero (block 208), which is to say that all of the constraints are satisfied and that none of the constraints are at a maximum limit, then a predetermined maximum level of current is selected (block 212). In the charging process 100, the maximum current level can be the maximum level of current that the charger 112 is configured to deliver to the battery 116.

Process 200 next identifies a predicted response of the battery 116 to the application of the maximum current level to predict the response of the battery cell and how the response of the cell affects the constraints $e_j$ (block 216). If the predicted changes to the constraint values $e_j$ remain less than or equal to zero (block 220), then the maximum current $I_{max}$ is applied to the charger (block 228). In some situations, each of the constraints $e_j$ remain strictly less than zero, which is to say that none of the constraints are at a maximum limit, but the charging process 100 applies the maximum available current to charge the battery 116 at the maximum rate practical for the configuration of the charger 112 and battery 116.

During process 200, if any of the constraints $e_j$ are not satisfied, such as the value of one or more of the constraints $e_j$ being greater than zero in the processing of blocks 208 or 220, then process 200 modifies the level of the current $I_M$ (block 232). The modified current $I_M$ is selected with an optimization function $f$ that selects a new current level with reference to the present current level $I_M$ that is predicted to violate the constraints, a current level from a previously selected current level in the process 200, and the constraint values $e_j$. Process 200 predicts the response of the battery to the new current $I_M$ and updates the constraints $e_j$ with reference to the prediction (block 236).

If one or more constraints $e_j$ from the predicted model are greater than zero (block 240), or if each of the predicted constraint values $e_j$ is strictly less than zero (block 244), then the current is modified again (block 232). The modification to the current level in the processing of block 232 can include decreasing the current level if the selected current level $I_M$ results in predicted values of one or more constraints $e_j$ being greater than zero (block 240), or increasing the level of current if level if the selected current level $I_M$ results in each of the constraints being strictly less than zero (block 244).

In some situations, the processing of blocks 232-244 continues for multiple iterations to select a current level $I_M$. Once process 200 identifies a current level $I_M$ that satisfies each of the constraints $e_j$ and maximizes at least one of the constraints $e_j$, the charger 112 supplies the identified current level $I_M$ is applied to the battery 116 during the next time increment K (block 228).

As described above, process 200 is performed for each of K time increments during the charging process described in FIG. 1 to select a maximum level of current that also enables the battery charging process to satisfy the constraints $e_j$ during each time increment of the charging process. The optimization of process 200 enables recharging of the battery 116 in a shorter time than existing CC/CV charging processes, while also reducing or eliminating the accelerated aging or deterioration of the battery by satisfying the selected constraints, such as maximum permitted internal state values, battery current, voltage, and temperature levels.

Figure 6:
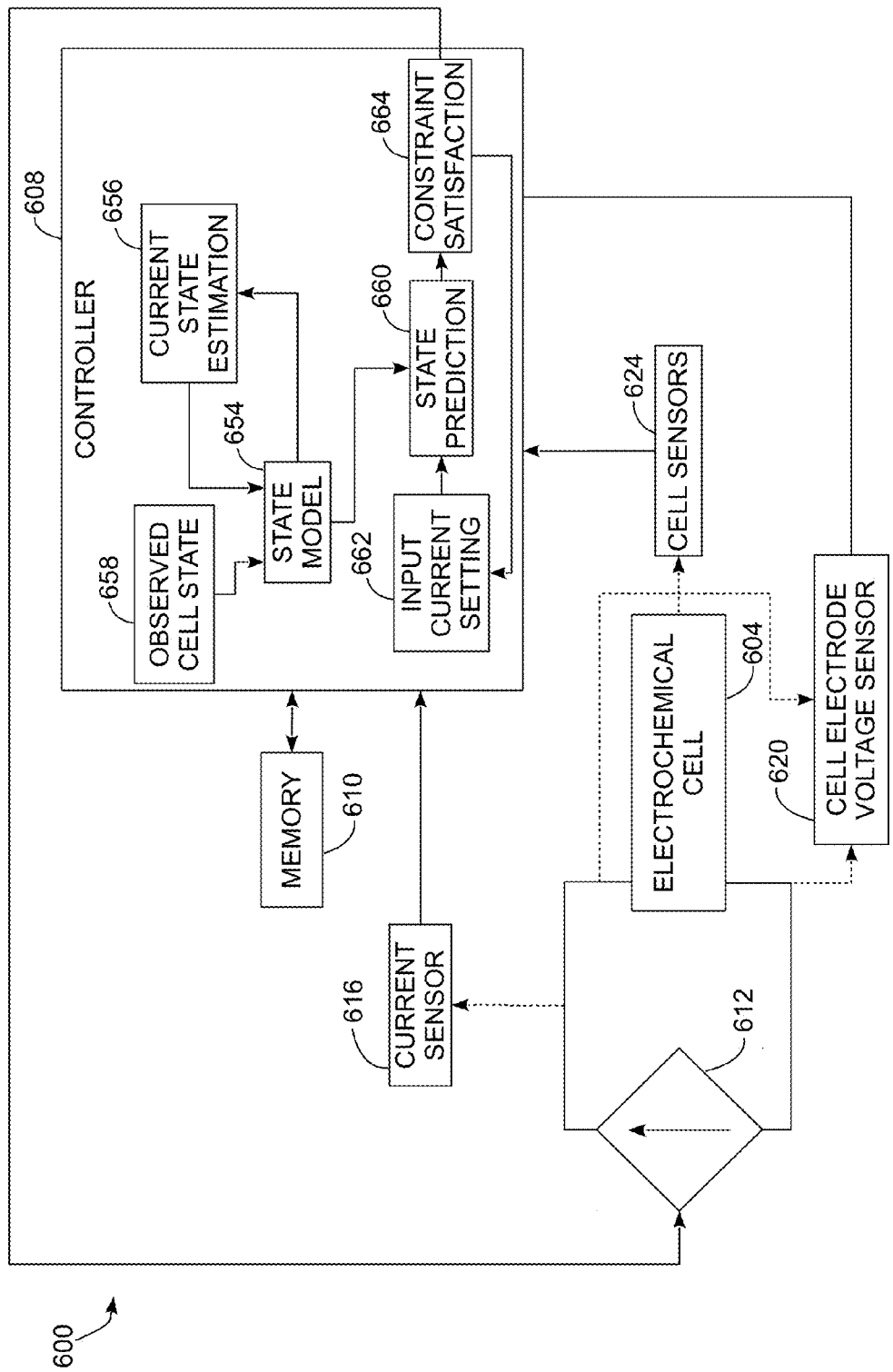
FIG. 6 is a schematic diagram of an illustrative embodiment of a battery charging system.

FIG. 6 depicts a battery charging system 600. The system 600 includes an electrochemical cell 604, controller 608, memory 610, current source 612, current sensor 616, cell electrode voltage sensor 620, and one or more additional cell sensors 624. The electrochemical cell 604 is illustrative of electrochemical cells that are used in a wide range of batteries including, but not limited to, lithium ion batteries. In the embodiment of FIG. 6, the electrochemical cell 604 includes two electrodes that are electrically connected to the current source 612 to enable the current source 612 to deliver an input electric current that charges the electrochemical cell 604. Some battery embodiments include multiple electrochemical cells. In one configuration, a battery includes one or more electrochemical cells that are integrated into a single physical package with two electrical terminals that receive current from an external current source during a charging operation. The battery package optionally includes one or more of the controller 608, current sensor 616, cell electrode voltage sensor 620, and cell sensors 624 to control the charging process of the battery.

In FIG. 6, the controller 608 is implemented as a digital control device that executes stored program instructions that are stored in the memory 610. In the illustrative embodiment of FIG. 6, the controller 608 is implemented as a digital microcontroller, but in alternative embodiments the controller 608 is, for example, a general purpose microprocessor, field programmable gate array (FPGA), application specific integrated circuit (ASIC), a digital signal processor (DSP), or any other suitable digital processor that incorporates hardware and software components to enable monitoring of the electrochemical cell 604 and control of the level of input current that is applied the electrochemical cell 604 during a charge process. The memory 610 includes one or more digital data storage devices including, but not limited to, random access memory (RAM), solid-state storage memory including NAND and NOR flash memories or EEPROM memory, magnetic and optical data storage media, and the like. The memory 610 also stores data corresponding to predetermined physical, chemical, and electrochemical properties of the electrochemical cell 604. The memory 610 also stores state model data corresponding to estimated internal parameters of the electrochemical cell 604, predetermined constraint parameters that are used to limit the input current to the electrochemical cell 604, and sensor data received from one or more sensors in the system 600.

The controller 608 includes one or more hardware and software components that implement a state model 654, current state estimation module 656, observed cell state module 658, future state prediction module 660, input current signal generator 662, and a constraint satisfaction module 664. The state model 654 is an analytical model that is used to track parameters of the operating condition in the electrochemical cell 604. In the system 600, some of the parameters in the model are measured using sensors, such as the current sensor 616 and the electrode voltage sensor 620. The state model 654 also models data that are used for generation of approximations for state parameters that are not measured directly through the sensors. For example, in some embodiments of the system 600 the internal temperature, overpotential, and an electrode concentration gradient for the solid metal reaction agent in the electrodes of the electrochemical cell 604 are three state parameters that are not directly measured by sensors in the system 600.

In the system 600, the state model 654 and the current state estimation module 656 generate approximations of the present state for state parameters that are not measured directly by sensors in the system 600. The state estimation module 656 also generates estimates of one or more state parameters in the electrochemical cell 604 that are measured by one or more sensors. For example, in the system 600 the current sensor 616 measures the level of electrical current that flows through the electrochemical cell 604 during the charge process, and the cell electrode voltage sensor 620 measures the voltage potential between the electrodes in the electrochemical cell during the charging process. In some embodiments, the system 600 includes additional sensors that are illustrated by the cell sensors 624. For example, in once configuration an external temperature sensor 624 generates measures an ambient temperature around the electrochemical cell 604, although the internal temperature of the electrochemical cell 604 differs from the ambient temperature.

During operation, the controller 608 receives the measured data from the sensors in the system 600 and compares the measured data to the outputs of the current state estimation module 656. In the system 600, the observed cell state module 658 includes present state parameter data that the controller 608 receives from external sensors such as the current sensor 616, voltage sensor 620, and any additional sensors 624. If the estimated outputs of the current state estimation module 656 diverge from the measured sensor data form the observed cell state module 658, then the controller 608 modifies the state model 654 to correct the error between the estimated parameters and the measured parameters. In one embodiment, the controller 608 modifies the state model 654 in an iterative manner until the current state estimation module 656 generates estimated output parameters for the electrochemical cell 604 that are within a predetermined margin of error to the measured data from the sensors.

In the controller 608, the state prediction module 660 generates a prediction of the state of the electrochemical cell after application of a given current input level to the electrochemical cell 604 for a predetermined time. In the example of FIG. 6, an electrical current input module 662 generates data corresponding to different levels of electrical current input that are within the operating range of the current source 612. The state prediction module 660 generates a prediction of one or more state parameters after application of the input current given the present time state of the electrochemical cell 604, which is determined from the state model 654. For example, the state prediction module 660 generates a prediction of the overpotential in the electrochemical cell 604 given the present state parameters of the electrochemical cell 604 from the state model 654, a selected current input level from the input currents module 662, and a predetermined time period. One of the present-time state parameters is the present level of overpotential in the electrochemical cell 604, although other present-time state parameters such as the internal temperature of the electrochemical cell 604 can also affect the predicted value of the state parameter.

In one embodiment, the state prediction module 660 uses the state model 654 with the present time state parameters in the state model data 654 to perform a simulation of the state of the electrochemical cell 604 over the predetermined time period, such as a thirty-second time period, using a given current input from the input current setting module 662. The state prediction model 660 then extracts the parameter data corresponding to a state parameter of interest from the model 654 after completion of the predetermined time period in the simulation. In another embodiment, the state prediction module 660 retrieves the state parameter data corresponding to the present state of the electrochemical cell 604 from the state model 654. The state prediction module 660 applies a regression or other estimation process given the level of input current from the input current setting module 662 to generate a prediction of one or more state parameters after the predetermined time period.

While FIG. 6 depicts the state prediction module 660 in a configuration where the state model 654 and current level from the input current setting module 662 are used to predict the state of one or more internal parameters of the electrochemical cell 604, in another embodiment the state prediction module 660 receives direct state information from one or more sensors that are associated with the electrochemical cell 604. For example, in one embodiment the cell sensors 624 include one or more temperature sensors that provide accurate measurements of the internal temperatures in the electrochemical cell 604. The state prediction module 660 receives the direct temperature measurement data from the sensors 624 and uses a predictive model, such as a regression model, to generate a prediction of the temperature of the electrochemical cell 604 for a given level of input current over a predetermined time period.

In the controller 608, the constraint satisfaction module 664 receives one or more of the predicted state parameters from the state prediction modules 660. The constraint satisfaction module 664 compares the predicted values of state parameters in the electrochemical cell 604 to predetermined constraint values that are stored in the memory 610. In one embodiment, the predetermined constraint values are identified based on the physical and chemical characteristics of the electrochemical cell. In one embodiment, the constraints change over time during operation of the electrochemical cell 604 to account for the effects of aging on the characteristics of the electrochemical cell 604.

As described above, in one embodiment the constraint satisfaction module receives predicted state parameter data corresponding to an internal temperature, overpotential, and electrode concentration gradient for the electrochemical cell 604. The constraint satisfaction module 664 compares the predicted values for each of the state parameters and compares the predicted parameter values to the predetermined constraints. If each of the predicted temperature, overpotential, and electrode concentration gradient state parameters fall below the predetermined threshold, then the corresponding input current setting associated with the predicted state parameter values can be used for charging the battery for the predetermined time. If any one of the predicted state parameter values fails to meet the constraint, then the corresponding input current setting associated with the predicted state parameter values is too great for use in charging the electrochemical cell 604 during the next period. In one configuration, the input current settings 662 begin with a maximum operational current setting for the current source 612 and the constraint satisfaction module 664 iteratively selects lower current level settings, if necessary, until the constraint satisfaction module 664 identifies a maximum current level for which all the predicted state parameter values satisfy the constraints. In one configuration, the maximum operating current level from the current source 612 is applied to the electrochemical cell 604 when all predicted parameter states from the state prediction module 660 satisfy the respective constraints in the constraint satisfaction module 664. The constraint satisfaction module 664 and controller 608 generate an output signal to adjust the current source 612 supply the input current to the electrochemical cell 604 at the determined current level for up to the predetermined time period.

In another configuration, the constraint satisfaction module 664 first identifies if a present level of input current that the current source 612 applies to the electrochemical cell 604 meets all of the constraints. If the present level of current fails to meet any of the constraints, then the constraint satisfaction module selects lower levels of current from the input current settings module 662 until the constraints are satisfied. If each of the predicted state parameters from the state prediction module 660 satisfy the corresponding constraints in the constraint satisfaction module 664, then the constraint satisfaction module 664 optionally determines if an increased current level would also satisfy the constraints using an increased current level from the input current settings module 662 and the state prediction module 660. The constraint satisfaction module 664 and controller 608 generate a signal to increase or decrease the level of current from the current source 612 to apply current at the determined level to the electrochemical cell 604.

As described above with reference to FIG. 6, the system 600 includes a state model that produces estimates of the values of state parameters in the electrochemical cell 604 using predetermined physical and chemical characteristics of the electrochemical cell 604 and data received from one or more sensors. In one embodiment, the state model corresponds to a one-dimensional model of the physical structures and chemical composition of an electrochemical cell, such as the cell 604. The model is one-dimensional, which is to say that a physical model of an electrochemical cell with three-dimensional electrodes, a separator between the electrodes, and other structures in the electrochemical cell are simplified to different locations along a one-dimensional axis in the spatial domain, where the variable x refers to a coordinate on the one-dimensional axis at different locations within the one-dimensional cell model. For example, the electrodes and the separator in the electrochemical cell each occupy a range of coordinates x along the axis. In the system 600, the memory 610 stores data corresponding to the model parameters that are listed below, and the controller 608 executes stored software instructions to determine the state parameters according to the equations listed below to update the model during the charging process.

Figure 7:
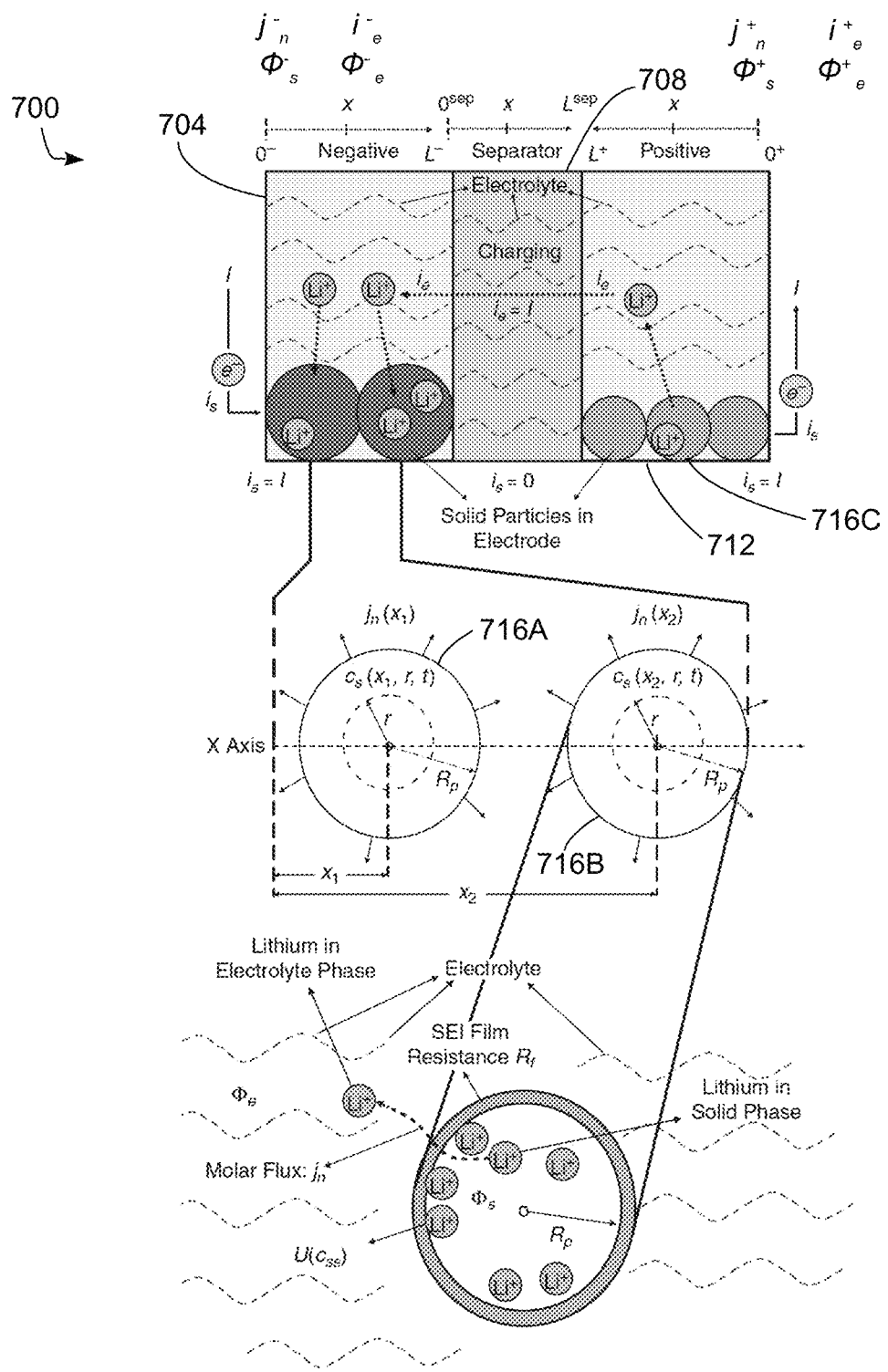
FIG. 7 is a prior art diagram of model that is used to determine parameters in an electrochemical cell of a battery.

FIG. 7 depicts a prior art diagrams of a model of an electrochemical cell that is arranged along a one-dimensional spatial axis. In FIG. 7, an electrochemical cell 700 includes a negative electrode 704, separator 708, and positive electrode 712. The negative and positive electrodes 704 and 712, respectively, each include a series of solid particles, such as particles 716A, 716B, and 716C that are arranged linearly along the spatial dimension x. During a charging process, an external current source provides electrons to the negative electrode 704, which attracts positive ions from the positive electrode 712 through the separator 708 to the negative electrode 704. Lithium ions are extracted from particles in the positive electrode 712, such as particle 716C, and move in the electrolyte medium to the negative electrode 704 due to the attraction between the electrons and lithium ions. In the example of FIG. 7, the positive ions depicted as lithium ($Li^+$) ions for illustrative purposes, but other positive metallic ions are used in different electrochemical cell embodiments. The $Li^+$ ions from the positive electrode 712 precipitate from the electrolyte in the electrochemical cell 700 and accumulate as solid-phase lithium in the particles of the negative electrode, such as the particles 716A and 716B. The particles 716A and 716B are modeled as spherical particles.

Inside each particle of the negative electrode 704, the lithium forms a concentration gradient from the outermost radius $R_p$ of each particle toward the center of each particle along a radius r during the charging process. The concentration of lithium in the particles at different times during the charging process is depicted as the function $c_s(x,r,t)$, where each particle is identified using the x location coordinate in the negative electrode 704, r is the radius coordinate inside of each particle from the center of the particle to the outer radius $R_p$, and t represents time during the charging process. As depicted in the following equation 2, the rate of change of the metal concentration in each particle with respect to the radial coordinates r is referred to as the concentration gradient. The term $c_{ss}(x,t)$ refers to a concentration of solid phase lithium at the surface of the particles in the model of the electrochemical cell where $c_{ss}(x,t) \triangleq c_s(x,R_p,t)$. A concentration of metallic ions, such as $Li^+$ ions in the electrolyte is depicted as the function $c_e(x,t)$. In the electrodes, the terms $\Phi_s^-$ and $\Phi_s^+$ refer to potentials at different locations in the negative electrode 704 and positive electrode 712, respectively. The term $\Phi_e$ refers to a potential in the electrolyte of the electrochemical cell 700. The terms $j_n^-$ and $j_n^+$ refer to a molar flux in the negative electrode 704 and positive electrode 712, respectively. The term $i_e$ refers to an ionic current flow through the electrolyte in the electrochemical cell 700. The functions I(t) and V(t) refer to the current flow and electrode voltage, respectively, of the electrochemical cell at different times t during the charging process. Current and voltage sensors, such as the current sensor 616 and cell electrode voltage sensor 620 of the system 600, monitor the current and voltage during the charging cycle. Another parameter that is not depicted directly in FIG. 7 is the internal temperature of the electrochemical cell 700 at different locations and times during the charging process. As described in more detail below, the parameters listed above change at different locations in the electrochemical cell 700 in the spatial domain x and vary over time during the charging process in the time domain t.

The following equations define some of the internal parameters in the electrochemical cell:

$$\epsilon_e \frac{\partial c_e(x,t)}{\partial t} = \frac{\partial}{\partial x}\left(\epsilon_e D_e \frac{\partial c_e(x,t)}{\partial x} + \frac{1-t_c^0}{F}i_e(x,t)\right) \quad (1)$$

$$\frac{\partial c_s(x,r,t)}{\partial t} = \frac{1}{r^2}\frac{\partial}{\partial r}\left(D_s r^2 \frac{\partial c_s(x,r,t)}{\partial r}\right) \quad (2)$$

$$\frac{\partial \Phi_e(x,t))}{\partial x} = -\frac{i_e(x,t)}{\kappa} + \frac{2RT}{F}(1-t_c^0)\left(1+\frac{d\ln f_{c/a}(x,t)}{d\ln c_e(x,t)}\right)\frac{\partial \ln c_e(x,t)}{\partial x} \quad (3)$$

$$\frac{\partial \Phi_s(x,t)}{\partial x} = \frac{i_e(x,t)-I(t)}{\sigma} \quad (4)$$

$$\frac{\partial i_e(x,t))}{\partial x} = \frac{3\epsilon_s}{R_p}Fj_n(x,t) \quad (5)$$

$$j_n(x,t) = \frac{i_0(x,t)}{F}\left(e^{\frac{\alpha_a F}{RT}\eta(x,t)} - e^{\frac{-\alpha_a F}{RT}\eta(x,t)}\right) \quad (6)$$

$$i_0(x,t) = r_{eff} c_e(x,t)^{\alpha_a}(c_s^{max} - c_{ss}(x,t))^{\alpha_a} c_s(x,t)^{\alpha_c} \quad (7)$$

$$\eta \Phi_s(x,t) = \Phi_s(x,t) - \Phi_e(x,t) - U(c_{ss}(x,t)) - FR_f j_n(x,t) \quad (8)$$

$$T(t) = T(t^-) + \frac{dt}{\rho^{avg} c_p}h_{cell}(T_{amb}(t^-) - T(t^-)) + I(t^-)V(t^-) - \quad (9a)$$

$$\frac{dt}{\rho^{avg} c_p}\int_{0-}^{0+}\frac{3\epsilon_s}{R_p}Fj_n(x,t^-)\left(U(\bar{c}(x,t^-)) - T(t^-)\frac{\partial U(\bar{c}(x,t^-))}{\partial T}\right)dx$$

$$\rho^{avg} c_p \frac{dT(t)}{dt} = h_{cell}(T_{amb}(t) - T(t)) + I(t)V(t) - \quad (9b)$$

$$\int_{0-}^{0+}\frac{3\epsilon_s}{R_p}Fj_n(x,t)\left(U(\bar{c}(x,t)) - T(t)\frac{\partial U(\bar{c}(x,t))}{\partial T}\right)dx$$

$$\bar{c}(x,t) = \frac{3}{R_p^3}\int_0^{R_p} r^2 c(x,r,t)dr \quad (10)$$

At the beginning of a charge process, the state model of the electrochemical cell begins with initial conditions at time t=0. The initial conditions are set forth in the following equations:

$$c_e(x,0) = c_e^0(x), c_s(x,r,0) = c_s^0(x,r), T(0) = T^0 \quad (11)$$

During the modeling process, the conditions of the electrochemical cell at the locations of boundaries between different sections of the cell, such as the boundaries between the negative electrode 704, separator 708, and positive electrode 712 in the cell 700 of FIG. 7, are used to model the state of the electrochemical cell. As depicted in FIG. 7, the term $0^-$ refers to an end of the negative electrode 704 opposite the separator 708 in the spatial domain x, L⁻ refers to the spatial domain location of the boundary between the negative electrode 704 and the separator 708, the term L⁺ refers to the spatial domain location of the boundary between the separator 708 and the positive electrode 712, and the term 0⁺ refers to an end of the positive electrode 712 opposite the separator 708 in the spatial domain. In the separator 708, the term $0^{sep}$ refers to the boundary with the negative electrode 704, which is the same spatial location as L⁻, and the term $L^{sep}$ refers to the boundary with the positive electrode 712, which is the same spatial location as L⁺. As used in the following boundary condition equations, the term $x^{sep} \in \{0^{sep}, L^{sep}\}$ refers to the entire domain of the electrochemical cell in the separator. The following equations set forth the boundary conditions:

$$\frac{\partial c_e(0^-, t)}{\partial x} = \frac{\partial c_e(0^+, t)}{\partial x} = 0 \tag{12}$$

$$c_e(L^-, t) = c_e(0^{sep}, t), \quad c_e(L^{sep}, t) = c_e(L^+, t), \tag{13}$$

$$\varepsilon_e^- D_e \frac{\partial c_e(L^-, t)}{\partial x} = \varepsilon_e^{sep} D_e \frac{\partial c_e(0^{sep}, t)}{\partial x} \tag{14}$$

$$\varepsilon_e^{sep} D_e \frac{\partial c_e(L^{sep}, t)}{\partial x} = -\varepsilon_e^+ D_e \frac{\partial c_e(L^+, t)}{\partial x} \tag{15}$$

$$\frac{\partial c_s(x, 0, t)}{\partial r} = 0, \quad \frac{\partial c_s(x, R_p, t)}{\partial r} = -\frac{j_n(x, t)}{D_s} \tag{16}$$

$$\Phi_e(L^-, t) = \Phi_e(0^{sep}, t), \quad \Phi_e(L^{sep}, t) = \Phi_e(L^+, t) \tag{17}$$

$$\Phi_e(0^+, t) = 0 \tag{18}$$

$$i_e(0^-, t) = i_e(0^+, t), = 0 \; i_e(x^{sep}, t) = -I(t) \tag{19}$$

$$i_e(L^-, t) = -i_e(L^+, t) = -I(t) \tag{20}$$

$$\Theta(T) = \Theta_{T_0} e^{A_\theta \frac{T(t)-T_0}{T(t)T_0}} \tag{21}$$

$$V(t) = \Phi_s(0^+, t) - \Phi_s(0^-, t) \tag{22}$$

In the equations 1-22 above, $i_0(x,t)$ refers to an exchange current density over the spatial domain x and time t, $T_{amb}(t)$ refers to the ambient temperature around the electrochemical cell over time t, and $\bar{c}(x,t)$ refers to a volume averaged concentration of a particle, such as lithium or another metal, in the solid phase over the spatial domain x and time t. The terms $\epsilon_e$, $\epsilon_s$, $\sigma$, R, $R_p$, F, $\alpha_a$, $\alpha_c$, $\rho^{avg}$, $c_p$, $h_{cell}$, and $t_c^0$ are predetermined model parameters that are derived from the physical and chemical properties of the electrochemical cell and that remain constant at a given location x in the cell during a charge process. The term σ refers to electrical conductivity in the cell, F refers to Faraday's constant, $\alpha_a$ and $\alpha_c$ refer to charge transport coefficients, $h_{cell}$ refers a height dimension of the cell, and $\rho^{avg}$ refers to an average density of electrolyte. The terms $\epsilon_e^{sep}$ and $\epsilon_e^-$ refer to the volume fractions of the electrolyte in the individual domains of separator and negative electrode, respectively, in the electrochemical cell. The terms κ, $f_{c/a}$, and $D_e$ are predetermined functions of the electrolyte concentration in the electrochemical cell 700. The term κ is the ionic conductivity of the electrolyte, $f_{c/a}$ is a dimensionless number associated with a deviation of the electrolyte from an ideal electrolyte, and $D_e$ is the effective diffusion coefficient in the electrolyte. The term $D_s$ refers to a diffusion coefficient of the solid particles in the electrode. The term $R_f$ refers to a film resistance at the surface of particles in the electrochemical cell model. The term $r_{eff}$ refers to an effective resistance in the electrochemical cell. The terms $r_{eff}$, $R_f$, $D_s$, κ, and $D_e$ have a temperature dependence with an Arrhenius-like relationship $\Theta(T)$ that is set forth in the equation 21. The functions U correspond to equilibrium functions for the electrochemical cell for different solid concentration levels of the lithium or other metal in the cell during the charging process.

The term $$\frac{\partial c_s(x, r, t)}{\partial t}$$

in the equation 2 is the concentration gradient of metals in the particles of the electrodes which is the partial derivative of the concentration over the radius r for different particles over the spatial axis x and over time t. The term $\eta\Phi_s(x,t)$ in the equation 8 represents a level of overpotential in the cell over the spatial axis x and time t. In the equation 9a, T(t) represents the internal temperature of the electrochemical cell over time t. Equation 9a is a reformulation of the equation 9b that is solved for the T(t) term. In one embodiment, the battery charging system uses constraints for one or more of the concentration gradient, overpotential, and internal temperature state parameters to identify a maximum level of input current that can be applied to the cell while the predicted level for each of the state parameters satisfies the constraint over a predetermined time period.

During the charge process, the charging system applies current to the electrochemical cell in a range of zero current up to a predetermined maximum charging current level to charge the cell. The level of charge changes over time to maintain a maximum level of current $I_{max}$ that can be applied to the electrochemical cell while one or more state parameters in the cell remain within predetermined constrains. The basic relationship between input current over time and a level charge Q that is held in the electrochemical cell over time are set forth in the following equations:

$$0 \leq I(t) \leq I_{max} \tag{23}$$

$$Q = \int_0^{t_f} I(t) dt \tag{24}$$

Since the electrochemical cell has a finite capacity to hold charge, in a practical embodiment, the level of charge that is added to the electrochemical cell corresponds to an initial condition where the cell starts with an initial equilibrium voltage $V_0$ and the cell reaches a final equilibrium voltage $V_f$ at the conclusion of the charge process, where $V_0 \leq V_f$. The bulk state of charge in the negative electrode of the electrochemical cell and the state of charge in the electrochemical cell are set forth in the following equations:

$$Q = Q^-\left(SOC_{V_f}^- - SOC_{V_0}^-\right) \tag{25}$$

$$SOC^-(t) = \int_0^{L^-} \frac{\bar{c}^-(x,t)}{c_{max}^- L^-} dx = SOC^-(0) + \int_0^t \frac{I(\tau)}{Q^-} d\tau \tag{26}$$

Where $Q^-$ is a predetermined maximum capacity of the negative electrode in the electrochemical cell, and $SOC^-(t)$ is the state of charge of the cell over time t. Using a combination of equations 24-26 provides a solution for $SOC^-(t_f)$, where $t_f$ is the time at which the charge process is complete:

$$SOC^-(t_f) = SOC_{V_f}^- \tag{27}$$

During the charging process, the level of current that is applied to the electrochemical cell is limited to prevent excess aging from occurring in the electrochemical cell. As is known in the art, the maximum charge capacity of the cell decreases over the course of multiple charge and discharge cycles during the life of an electrochemical cell. In some cell configurations, applying a level of charge that would be acceptable for a new cell may damage or destroy the same cell after the cell has experienced aging. While some degree of aging is unavoidable, the rate of aging increases greatly if one or more state parameters in the electrochemical cell exceed certain levels during the charging process. As described above, the rate of aging in the cell increases if the internal temperature, overpotential, or metal concentration density gradient in the electrodes exceed predetermined maximum constraint limits. The equations 28-30 set forth the constraints for temperature, overpotential, and concentration density gradient, respectively:

$$T(t) \leq T_{max} \quad (28)$$

$$\eta_{sr}(x, t) = \Phi_s(x, t) - \Phi_e(x, t) - U_{sr}(x, t) > 0 \quad (29)$$

$$\frac{\partial c_s(x, r, t)}{\partial r} \leq \frac{\partial c^{max}}{\partial r} \quad (30)$$

In the equation 28, $T_{max}$ is a predetermined maximum internal temperature for the cell during the charging process, and $T(t)$ is taken from the equation 9a above or from sensor data that identify the internal temperature of the electrochemical cell in battery embodiments that include internal temperature sensors. In the equation 29, the term $U_{sr}(x,t)$ for the equilibrium potential in the battery is set to zero in one embodiment. Thus, the overpotential constraint is satisfied when the voltage potential $\Phi_s$ between the negative and positive electrodes in the electrochemical cell exceeds the voltage potential $\Phi_e$ in the electrolyte of the electrochemical cell. In the equation 30, the term $$\frac{\partial c^{max}}{\partial r}$$

is a maximum concentration gradient for a distribution of lithium or other metal in the particles of the electrodes in the cell model that is depicted in FIG. 7. The term $$\frac{\partial c_s(x, r, t)}{\partial r}$$

is the concentration gradient term in equation 2 above.

During the processes 100 and 200, a battery charging system, such as the system 600 of FIG. 6, identifies the maximum current level that can be applied to one or more electrochemical cells in a battery using the prediction processes described above in conjunction with the constraints to ensure that the predicted state parameters in the electrochemical cell do not exceed any of the constraints in the equations 28-30 for a given level of input current. During the processes 100 and 200, the optimization process determines a maximum level of input current that satisfies all of the constraints to minimize the time required to charge the electrochemical cells in the battery while maintaining the state parameters of the electrochemical cell within the predetermined constraint limits to avoid premature aging or other deterioration of the electrochemical cell. The optimal charging current is defined by the following equation:

$$I_{opt}(t) = \arg\min_{I(t)} \int_0^{t_f} 1 \, dt \quad (31)$$

The optimal current equation 31 is subject to the state model equations 1-9(b), 11-20, the input constraint equations 23 and 24, and the state parameter constraint equations 28-30. The optimization equation 31 can be difficult to solve for a general case in a practical battery system due to the nonlinear partial differential equations in the state model of the electrochemical cell, in addition to the constraints for the state parameters in the battery. If the constraints in equation 28-30 are ignored and if an arbitrary suitable maximum current constraint for equation 23 is supplied, then the optimal current equation 31 can be solved as set forth in the following equation:

$$I_{opt}(t) = I_{max}, t \in \left[0, \frac{Q}{I_{max}} 3600\right] \quad (32)$$

The equation 32 is not a satisfactory solution for practical battery embodiments because the optimization process in equation 32 allows for input current profiles that would drive the concentration of ions in the electrolyte to zero or result in all of the lithium transferring to a solid phase before the total charge Q is transferred to the electrochemical cell.

In a numeric simulation that solves the optimization equation 31 listed above, the input current is applied as a series of discrete input current levels over a series of discrete time periods during the charging process. In one embodiment, a mathematical simulation software program such as Matlab® is used to characterize the optimization process. The optimization process is initialized with a sequence of n input current values corresponding to the following equation:

$$\int_0^t I_i(r) dr = \sum_{i=1}^n I_i \delta t \geq Q \quad (33)$$

In one embodiment, a simulated charging process charges a cell from an initial voltage level $V_0=3V$ to a final voltage level $V_f=4.1V$ by applying different levels of input current at discrete 30 second time increments ($\delta t=30$ s). The internal temperature constraint in the electrochemical cell is set to $T_{max}=40°$ C. with a maximum input current $I_{max}=15$ A. The maximum reaction overpotential is defined with the following equation:

$$\eta_{sr}^{min}(t) = \inf_x(\eta_{sr}(x,t)) \quad (34)$$

Figure 3:
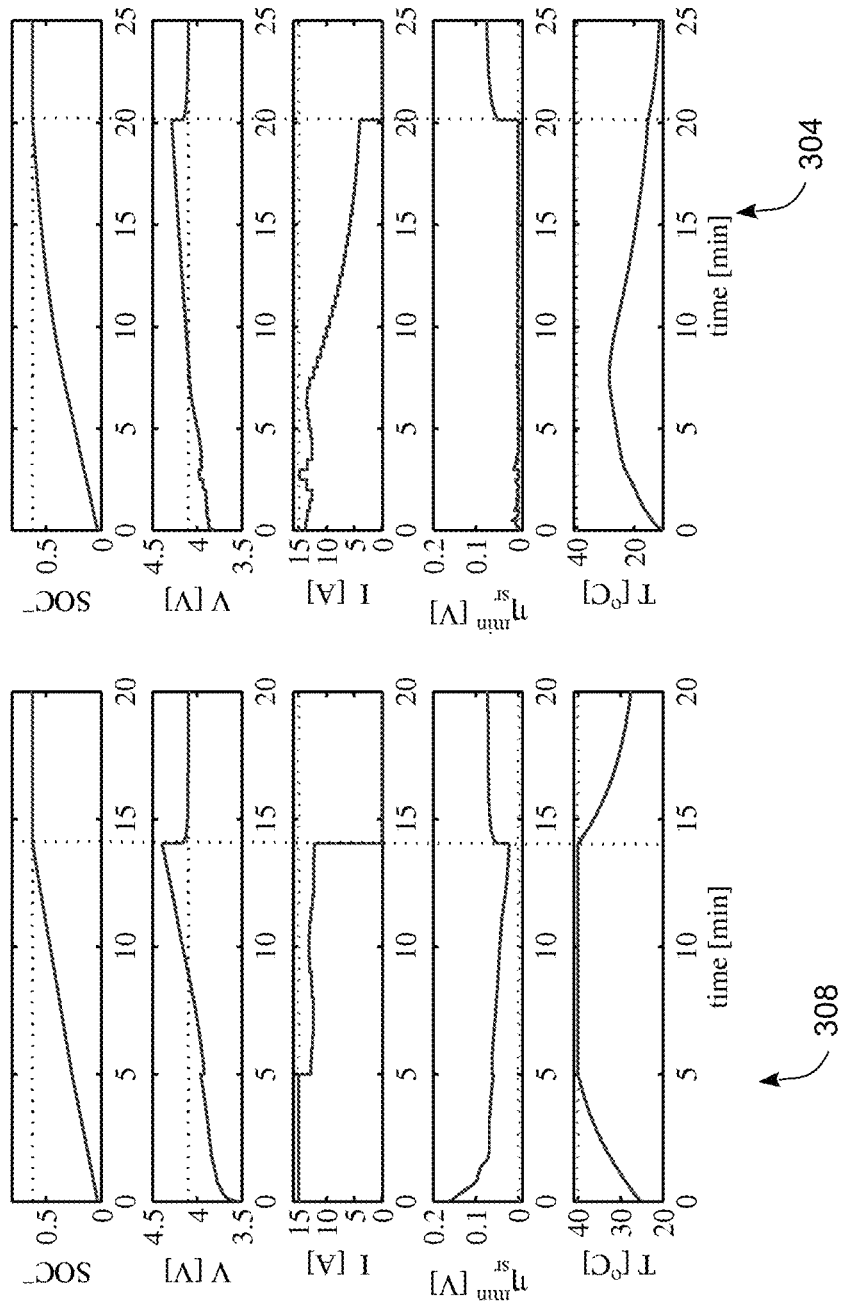
FIG. 3 is a graph depicting simulated results of charging a battery using an open-loop input current optimization strategy.

FIG. 3 depicts simulation results of the charging process at ambient temperatures of 10° C. (results 304) and 25° C. (results 308). The minimum charging times are calculated as 14 minutes and 20 minutes 10° C. and 25° C. ambient temperature processes, respectively. The optimal charging profile obtained at 25° C. includes two arcs, which are both determined by inequality constraints of the equation 31. During the first 5 minutes of the charging process, the input current is limited to $I_{max}$ by the input constraint in the equation 23. The rest of the charging profile is determined such that the temperature constraint in the equation 28 is not violated to maintain the battery at a constant temperature that does not exceed the $T_{max}=40°$ C. limit. In the results 308, the optimal current profile is discontinuous at the intersection of the constraints for the equations 23 and 28. Furthermore, at $T_{amb}=25°$ C., the kinetics of the battery are fast enough such that constraint in the equation 29 does not limit the input current during the simulated charging process.

For the results 304 at the ambient temperature of 10° C., FIG. 3 depicts a charging profile that includes three arcs. The first and the third arc are determined by the overpotential constraint of the equation 29. The internal temperature of the electrochemical cells in the battery increase during the charging process, which in turn leads to faster kinetics and a lower impedance of the battery. The lower impedance enables higher currents to be passed and, for a very brief period, the input current constraint of the equation 23 becomes active. The temperature constraint of the equation 28 is not reached during the simulation at the lower ambient temperature of 10° C. in the results 308.

In both charging scenarios that are depicted in FIG. 3, the optimal current profile satisfies the charge constraint Q of the equation 24, as can be seen in the SOC subplot in the result columns 304 and 308 in FIG. 3. Note that the transient voltage in both charging scenarios remains higher than $V_f$ for a prolonged time. However, after completion of the charging process, the voltage relaxes to the desired final equilibrium voltage $V_f$.

While the simulation and results that are illustrated in FIG. 3 enable an optimal charging strategy for a battery, the numerical simulation requires a level of computational power that is unavailable in many practical battery charging systems. Another embodiment generates an approximation of the solution for the optimal charging equation 31 using a closed-loop charging strategy that is effective for use in practical battery charging systems. The processes 100 and 200 described above are embodiments of the closed-loop charging strategy described herein, and the system 600 implements the closed-loop charging strategy as well.

In the closed-loop charging strategy, the time-optimal solution is given such that, at all times during the charging process, a maximum current that does not violate any of the input or parameter state constraints in the equations 23-24 and 28-30, is applied to the battery. Using this solution, a one-step predictive controller. The optimal current profile is approximated in time by a piece-wise constant profile for each discrete time interval $\delta t$. At each time interval, the predictive controller uses the state model to generate a prediction of the maximum current level (up to the predetermined $I_{max}$) that does not violate the constraints of the equations 23-24 and 28-30. The determined current is applied the battery for the time duration $\delta t$, and the predictive controller then repeats the process using updated state parameters from the state model or from sensors that are associated with the battery. Since the time interval $\delta t$ is often shorter than the total time needed to transfer the full charge to the battery, the closed-loop strategy abandon the equality constraint of the equation 24. Instead, the closed-loop control strategy uses the following SOC equation:

$$SOC^-(t) SOC_{V_f^-}, \forall t \qquad (35)$$

Using the predictive controller systems and methods described herein, the control problem in the closed-loop strategy is formulated for the identification of input current levels for each of a series of discrete time intervals during the charging process as set forth in the following optimization equation:

$$\min_{I(t)} \int_{0t}^{t+\delta t} -I(\tau) d\tau \qquad (36)$$

The solution to the equation 36 is subject to the state model equations 1-9(b), 11-20, the input constraint equations 23 and 24, and the state parameter constraint equations 28-30. During each of the discrete time steps $\delta t$, the controller generates a solution for the equation 36 corresponding to a maximum level of input current that does not violate any of the state parameter constraints of the equations 28-30 during the predetermined time period of $\delta t$ (e.g. 30 seconds). In a practical battery charging system embodiment, the optimization problem for a presented in equation 36 for a thirty second time span is solved in less than one second.

Figure 4:
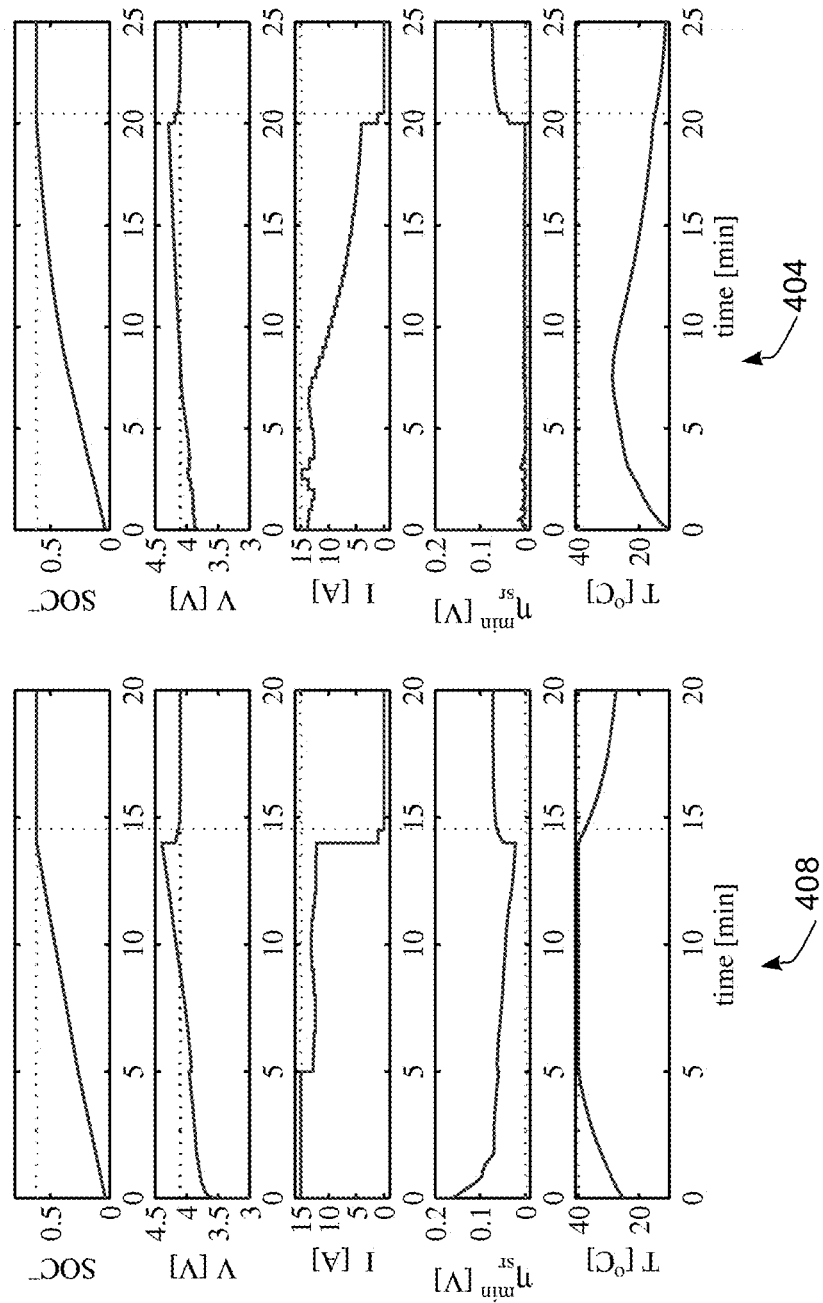
FIG. 4 is a graph depicting simulated results of charging a battery using a closed-loop input current optimization strategy.

FIG. 4 depicts results of a simulation using the closed-loop control scheme of the equation 36 for simulated charging processes that are conducted at ambient temperatures of 10° C. (column 404) and 25° C. (column 408). For comparison with the open-loop simulation results that are depicted in FIG. 3, the prediction time horizon is to $\delta t = 30$ s. As depicted in FIG. 4, the charging that is produced by the closed-loop controller is almost identical with the open-loop solution for the equation 31 of FIG. 3. The generated charging profiles differ only at the end of the charging process, where the charging current amplitude in the closed-loop strategy is determined such that the final SOC constraint of the equation 35 is not violated. During the charging process with the closed-loop strategy, a zero current is generated once the final SOC is reached, since any positive charging current violates the constraint of the equation 35.

Figure 5:
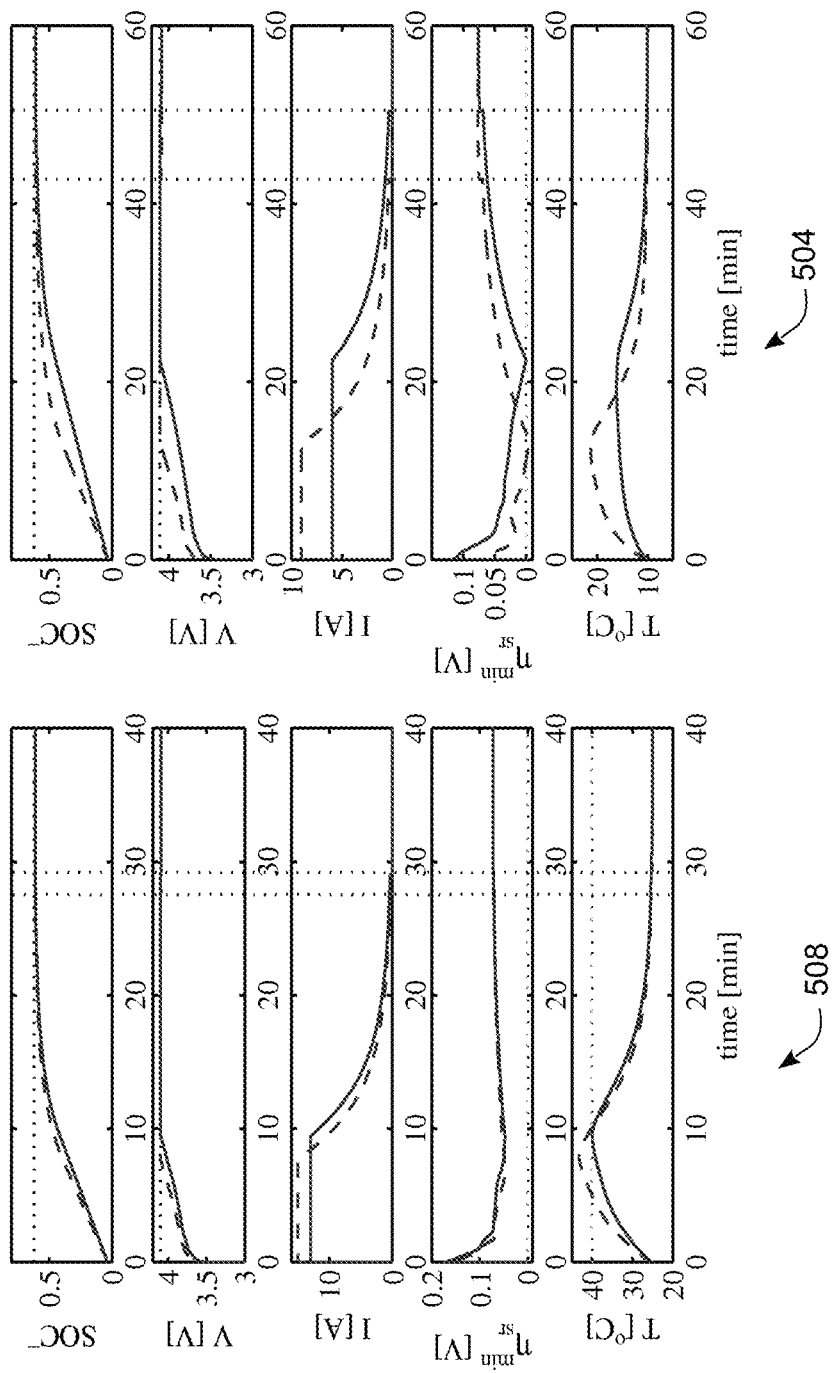
FIG. 5 is a prior art diagram depicting results of using existing CC-CV charging strategies to charge a battery.

The results depicted in FIG. 3 and FIG. 4 for either the open-loop or closed-loop optimization strategies both enable greatly reduced charging times for electrochemical cells in batteries when compared to prior art CC-CV charging strategies that are employed in existing battery charging systems. For example, FIG. 5 depicts simulation results for a prior art CC-CV charging algorithm that is applied at ambient temperatures of 10° C. (column 504) and 25° C. (column 508). The graphs in FIG. 5 depict results for two aggressive CC current levels to depict what the prior art considers to be a high-speed charging process. At $T_{amb} = 25°$ C. in the result column 508, a CC current of 13 A (solid line) does not violate any constraints and charges the battery in 29 minutes, while a larger CC current of 15 A (dashed line) charges the battery in 27 minutes but violates the temperature constraint of the equation 28. At $T_{amb} = 10°$ C. in the result column 504, a CC current of 6 A (solid line) does not violate any constraints and charges the battery in 50 minutes, while a larger CC current of 9 A (dashed line) charges the battery in 40 minutes but violates the overpotential constraint of the equation 29. Note that in all cases, the charging is stopped by $I_{cut}$ and the charging is incomplete, as can be seen by a relaxed voltage value less than $V_{cut}$. Thus, even using an aggressive charging strategy with a prior art charging process, the simulation results at 25° C. and 10° C. show best-case charge times of 27 minutes and 40 minutes, respectively, which are substantially longer than the respective charge times of 20 minutes and 14 minutes of the open-loop and closed-loop strategies that are described herein. The overly aggressive prior art charging processes violate state constraints for the batteries, which can lead to premature aging or damage to the batteries. Furthermore, as depicted in FIG. 5 the final voltage level $V_f$ of the battery after completion of the prior art charging process falls below the comparable $V_f$ levels for the open-loop and closed-loop charging strategies described herein, which indicates that the battery charged with the prior art charging process actually stores a lower level of charge Q than if the same battery is charged using the open-loop or closed-loop charging processes. Consequently, the improved battery charging systems and processes described herein enable battery charging in less time, with reduced aging effects to the electrochemical cells in the battery, and enable the battery to store more charge than is achieved using the prior art CC-CV techniques.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed is:

1. An electrochemical battery system, comprising:
   at least one electrochemical cell;
   a memory in which command instructions are stored; and
   a controller operably connected to the memory and a current source, the controller configured to execute the command instructions to:
   generate a prediction of at least one state parameter corresponding to an internal state of the at least one electrochemical cell after a first input current is applied to the at least one electrochemical cell for a predetermined time based upon a present state of the at least one state parameter in the electrochemical cell;
   determine a second input current based on the prediction and at least one predetermined state parameter constraint, wherein the controller determines that the second input current is greater than the first input current in response to the prediction satisfying the at least one predetermined state parameter constraint, and the controller determines that the second input current is less than the first input current in response to the prediction failing to satisfy the at least one predetermined state parameter constraint; and
   control the current source to apply the second input current to the at least one electrochemical cell.

2. The system of claim 1, wherein the memory stores a state model of the at least one electrochemical cell and the controller is configured to determine the at least one state parameter in the electrochemical cell based on an estimate of the at least one state parameter in the state model.

3. The system of claim 1 further comprising:
   a sensor operably connected to the at least one electrochemical cell and configured to generate data for the at least one state parameter; and
   the controller being operably connected to the sensor to receive the sensor data, the controller further configured to:
   determine the present state of the at least one state parameter based on the generated data from the sensor.

4. The system of claim 1, wherein the at least one predetermined state parameter constraint includes a maximum temperature constraint and the controller is further configured to execute the command instructions to:
   generate a temperature prediction associated with the at least one electrochemical cell based upon (i) the application of the first input current, and (ii) a determined value of a present temperature of the at least one electrochemical cell; wherein satisfying the at least one predetermined state parameter constraint and failing to satisfy the at least one predetermined state parameter constraint is determined by comparing the temperature prediction to a predetermined maximum temperature.

5. The system of claim 1, wherein the at least one predetermined state parameter constraint includes an overpotential constraint and the controller is further configured to:
   generate an overpotential prediction associated with the at least one electrochemical cell based upon (i) the application of the first input current, and (ii) a determined value of a present overpotential of the at least one electrochemical cell; wherein satisfying the at least one predetermined state parameter constraint and failing to satisfy the at least one predetermined state parameter constraint is determined by comparing the overpotential prediction to a predetermined maximum potential.

6. The system of claim 5, wherein the determined value of the present overpotential of the at least one electrochemical cell is generated according to the following equation:

$$\eta_{sr}(x,t) = \Phi_s(x,t) - \Phi_e(x,t) - U_{sr}(x,t),$$

wherein t represents time;
x represents a spatial domain in the electrochemical cell;
$\Phi_s(x, t)$ is a function corresponding to a potential between electrodes in the at least one electrochemical cell over the spatial domain x and time t;
$\Phi_e(x, t)$ is a function corresponding to a potential in electrolyte in the at least one electrochemical cell over the spatial domain x and time t; and
$U_{sr}(x, t)$ is a function corresponding to the equilibrium potential of an electrochemical reaction in the electrochemical cell over the spatial domain x and time t.

7. The system of claim 1, wherein the at least one predetermined state parameter constraint includes an electrode concentration gradient constraint and the controller is further configured to:
   generate an electrode concentration gradient prediction associated with at least one electrode in the at least one electrochemical cell based upon (i) the application of the first input current, and, and (ii) a determined value of a present electrode concentration gradient of the at least one electrochemical cell; wherein satisfying the at least one predetermined state parameter constraint and failing to satisfy the at least one predetermined state parameter constraint is determined by comparing the electrode concentration gradient prediction to a predetermined maximum concentration gradient.

8. The system of claim 7, wherein the determined value of the electrode concentration gradient in the at least one electrochemical cell is generated according to the following equation:

$$\frac{\partial c_s(x, r, t)}{\partial r},$$

wherein t represents time;
x represents a spatial domain in the electrochemical cell;
r represents radial coordinates in a particle in an electrode of the at least one electrochemical cell; and
c(x, r, t) is a function of metal concentration in one or more particles in electrodes of the at least one electrochemical cell over the spatial domain x, the radial coordinates r, and time t.

9. The system of claim 8, wherein the metal comprises lithium.

10. The system of claim 1, wherein the controller controls the current source to apply the second input current to the at least one electrochemical cell for the predetermined time.

11. The system of claim 1, the controller further configured to:
   determine a third input current based on the prediction and the at least one predetermined state parameter constraint;
   generate another prediction of the at least one state parameter corresponding to the internal state of the at least one electrochemical cell after the third input current is applied to the at least one electrochemical cell for the predetermined time based upon the present state of the at least one state parameter in the electrochemical cell; and determine the second input current in response to a failure of the other prediction to satisfy the at least one predetermined state parameter constraint.

12. A method of charging an electrochemical battery comprising:
   generating a prediction of at least one state parameter corresponding to an internal state of at least one electrochemical cell after a first input current is applied to the at least one electrochemical cell for a predetermined time based upon a present state of the at least one state parameter in the electrochemical cell;
   determining a second input current based on the prediction and at least one predetermined state parameter constraint, wherein determining the second input current further comprises:
      determining a second input current that is greater than the first input current in response to the prediction satisfying the at least one predetermined state parameter constraint; and
      determining a second input current that is less than the first input current in response to the prediction failing to satisfy the at least one predetermined state parameter constraint; and
   controlling a current source to apply the second input current to the at least one electrochemical cell.

13. The method of claim 12 wherein the present state of the at least one state parameter in the at least one electrochemical cell is determined based on an estimate of the at least one state parameter in a state model of the at least one electrochemical cell.

14. The method of claim 12 wherein the present state of the at least one state parameter in the at least one electrochemical cell is determined based on data received from a sensor that is associated with the at least one electrochemical cell.

15. The method of claim 12, wherein the at least one predetermined state parameter constraint includes a maximum temperature constraint and the generation of the prediction further comprises:
   generating a temperature prediction associated with the at least one electrochemical cell based upon (i) the application of the first input current, and (ii) a determined value of a present temperature of the at least one electrochemical cell; wherein satisfying the at least one predetermined state parameter constraint and failing to satisfy the at least one predetermined state parameter constraint is determined by comparing the temperature prediction to a predetermined maximum temperature.

16. The method of claim 12, wherein the at least one predetermined state parameter constraint includes an overpotential constraint and the generation of the prediction further comprises:
   generating an overpotential prediction associated with the at least one electrochemical cell based upon (i) the application of the first input current, and (ii) a determined value of a present overpotential of the at least one electrochemical cell; wherein satisfying the at least one predetermined state parameter constraint and failing to satisfy the at least one predetermined state parameter constraint is determined by comparing the overpotential prediction to a predetermined maximum potential.

17. The method of claim 12, wherein the at least one predetermined state parameter constraint includes an electrode concentration gradient constraint and the generation of the prediction further comprises:
   generating an electrode concentration gradient prediction associated with at least one electrode in the at least one electrochemical cell based upon (i) the application of the first input current, and, and (ii) a determined value of a present electrode concentration gradient of the at least one electrochemical cell; wherein satisfying the at least one predetermined state parameter constraint and failing to satisfy the at least one predetermined state parameter constraint is determined by comparing the electrode concentration gradient prediction to a predetermined maximum concentration gradient.

* * * * *